United States Patent [19]
Watanabe et al.

[11] Patent Number: 5,396,247
[45] Date of Patent: Mar. 7, 1995

[54] ANALOG-TO-DIGITAL CONVERSION CIRCUIT HAVING A PULSE CIRCULATING PORTION

[75] Inventors: Takamoto Watanabe, Nagoya; Yoshinori Ohtsuka; Tadashi Hattori, both of Okazaki, all of Japan

[73] Assignee: Nippondenso Co., Ltd., Aichi, Japan

[21] Appl. No.: 31,262

[22] Filed: Mar. 15, 1993

[30] Foreign Application Priority Data

Mar. 16, 1992 [JP] Japan .................................. 4-058027

[51] Int. Cl.$^6$ ............................................. H03M 1/60
[52] U.S. Cl. .................................... 341/157; 341/166; 377/42
[58] Field of Search ....................... 341/118, 157, 166; 377/42, 124, 126, 129; 331/65, 66

[56]      References Cited

U.S. PATENT DOCUMENTS

| 4,758,821 | 7/1988 | Nelson et al. | 341/157 |
| 4,998,109 | 3/1991 | LeChevalier | 341/166 |
| 5,128,624 | 7/1992 | Hashino et al. | 328/133 |

OTHER PUBLICATIONS

"A 16b Oversampling A/D Conversion Technology using Triple Integration Noise Shaping" by Yasuyuki Matsuya et al; 1987 IEEE International Solid-State Circuits Conference: pp., 48–49.

"The Design of The High Speed A/D Converter by using Multi-Valued Logic " by G. U. Weinan; 1989 IEEE; pp., 188–194.

"A 12BIT 5μsec CMOS Recursive ADC With 25mW power Consumption" by M. Yotsuyanagi et al; Proc. IEEE Custom Integr. Circuits Conf.; 1989; pp., 6.4.1–6.4.4.

"An 8–b 1.3–MHz Successive-Approximation A/D Converter" by K. H. Hadidi et al; IEEE Journal of Solid–State Circuits, vol. 25, No. 3; Jun. 1990; pp., 880–885.

Primary Examiner—Howard L. Williams
Attorney, Agent, or Firm—Cushman, Darby & Cushman

[57]  ABSTRACT

A pulse circulating circuit includes inverting circuits each for inverting an input signal and outputting an inversion of the input signal. A time of signal inversion by each of the inverting circuits varies in accordance with a power supply voltage applied thereto. One of the inverting circuits constitutes an inverting circuit for starting which is controllable in inversion operation. The pulse circulating circuit circulates a pulse signal therethrough after the inverting circuit for starting starts to operate. An input terminal subjected to an analog voltage signal is connected to power supply lines of the respective inverting circuits for applying the analog voltage signal to the inverting circuits as a power supply voltage fed thereto. A counter serves to count a number of times of complete circulation of the pulse signal through the pulse circulating circuit. A circulation position detecting device serves to detect a circulation position of the pulse signal in the pulse circulating circuit on the basis of output signals of the respective inverting circuits. A control device is operative for activating the inverting circuit for starting and thereby starting pulse circulating operation of the pulse circulating circuit, and for activating the circulation position detecting means at a moment which follows a moment of starting pulse circulating operation by a given time. An output device is operative for outputting digital data as an A/D conversion result. The A/D conversion result data has lower bits composed of output digital data of the circulation position detecting device, and higher bits composed of output digital data of the counter.

21 Claims, 8 Drawing Sheets

ANALOG-TO-DIGITAL CONVERSION CIRCUIT HAVING A PULSE CIRCULATING PORTION

BACKGROUND OF THE INVENTION

1. Field of the Invention

This invention relates to an analog-to-digital converting circuit generally shortened to an A/D converting circuit.

2. Description of the Prior Art

Typical A/D converting circuits include an array of voltage comparators which compare an input analog voltage with different reference voltages to convert the input analog voltage into a corresponding digital signal.

In the case where an input analog voltage to be converted is variable in a small range, it is known to provide an amplifier at a stage preceding a comparator array to amplify the input analog voltage before the execution of conversion thereof.

Most such amplifiers are unsuitable for use at high temperatures such as in automotive use. When such amplifiers are used at high temperatures, their operation tends to be wrong. Thus, it is generally difficult to use A/D converting circuits including amplifiers at high temperatures.

SUMMARY OF THE INVENTION

It is an object of this invention to provide an improved A/D converting circuit.

A first aspect of this invention provides an A/D converting circuit for converting an analog voltage signal into corresponding digital data which comprises a pulse circulating circuit which includes inverting circuits each for inverting an input signal thereto and outputting an inversion of the input signal, wherein a time of signal inversion by each of the inverting circuits varies in accordance with a power supply voltage applied thereto, wherein one of the inverting circuits constitutes an inverting circuit for stating which is controllable in inversion operation, and wherein the pulse circulating circuit circulates a pulse signal therethrough after the inverting circuit for starting starts to operate; an input terminal subjected to the analog voltage signal and connected to power supply lines of the respective inverting circuits for applying the analog voltage signal to the inverting circuits as a power supply voltage fed thereto; a counter for counting a number of times of complete circulation of the pulse signal through the pulse circulating circuit, and for outputting digital data representing a result of said counting; circulation position detecting means for detecting a circulation position of the pulse signal in the pulse circulating circuit on the basis of output signals of the respective inverting circuits, and for outputting digital data representing the detected circulation position of the pulse signal; control means for activating the inverting circuit for starting and thereby starting pulse circulating operation of the pulse circulating circuit, and for activating the circulation position detecting means at a moment which follows a moment of said starting pulse circulating operation by a given time; and output means for outputting digital data as an A/D conversion result, the A/D conversion result data having lower bits composed of the output digital data of the circulation position detecting means and higher bits composed of the output digital data of the counter.

A second aspect of this invention provides an A/D converting circuit comprising means, including a loop circuit, for circulating a pulse signal through the loop circuit at a variable speed; means for varying the speed of circulation of the pulse signal through the loop circuit in response to an input analog signal; means for detecting the speed of circulation of the pulse signal through the loop circuit; and means for generating a digital, signal in response to the detected speed of circulation of the pulse signal through the loop circuit, the digital signal representing a result of A/D conversion of the input analog signal.

A third aspect of this invention provides an A/D converting circuit comprising means for selecting either an input analog signal or a predetermined reference analog signal; means, including a loop circuit, for circulating a pulse signal through the loop circuit at a variable speed; means for varying the speed of circulation of the pulse signal through the loop circuit in response to the analog signal selected by the selecting means; means for detecting the speed of circulation of the pulse signal through the loop circuit; means for generating a first digital signal in response to the detected speed of circulation of the pulse signal through the loop circuit when the analog signal selected by the selecting means is the input analog signal; means for generating a second digital signal in response to the detected speed of circulation of the pulse signal through the loop circuit when the analog signal selected by the selecting means is the reference analog signal; and means for correcting the first digital signal into a third digital signal in response to the second digital signal, the third digital signal representing a result of A/D conversion of the input analog signal.

A fourth aspect of this invention provides an A/D converting circuit comprising means for iteratively selecting either of an input analog signal, a first predetermined reference analog signal, and a second predetermined reference analog signal, wherein the input analog signal is variable in a given range defined between a lower limit and an upper limit, and wherein the first predetermined reference analog signal and the second predetermined reference analog signal correspond to the lower limit and the upper limit respectively; means, including a loop circuit, for circulating a pulse signal through the loop circuit at a variable speed; means for varying the speed of circulation of the pulse signal through the loop circuit in response to the analog signal selected by the selecting means; means for detecting a distance travelled by the pulse signal circulated through the loop circuit during an adjustable interval; means for generating a first digital signal in response to the detected distance when the analog signal selected by the selecting means is the first reference analog signal; means for generating a second digital signal in response to the detected distance through the loop circuit when the analog signal selected by the selecting means is the second reference analog signal; means for generating a third digital signal corresponding to a difference between the first digital signal and the second digital signal; means for adjusting the interval in response to the third digital signal and a fourth digital signal which represents a predetermined fixed difference between the first digital signal and the second digital signal so as to hold the third digital signal substantially equal to the fourth digital signal; and means for generating a fifth digital signal in response to the detected distance when the analog signal selected by the selecting means is the input analog signal, the fifth digital signal representing a result of A/D conversion of the input analog signal.

DESCRIPTION OF THE FIRST PREFERRED EMBODIMENT

Figure 1:
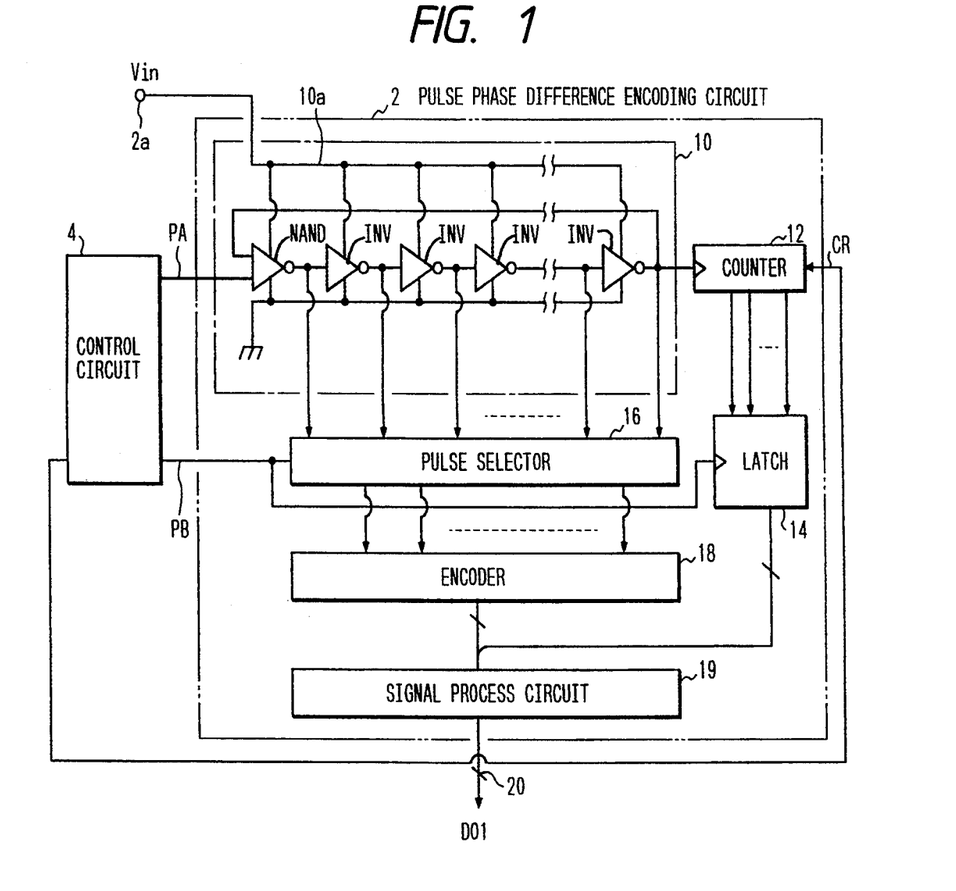
FIG. 1 is a block diagram of an A/D converting circuit according to a first embodiment of this invention.

With reference to FIG. 1, an A/D converting circuit includes a pulse phase difference encoding circuit 2 and a control circuit 4. The control circuit 4 includes a generator which produces pulse signals PA and PB, and a counter reset signal CR. The pulse phase difference encoding circuit 2 receives the pulse signals PA and PB from the control circuit 4. This circuit 2 encodes a difference between phases of the pulse signals PA and PB.

The pulse phase difference encoding circuit 2 includes a pulse circulating circuit or a delayed pule generating ring circuit 10, a counter 12, a latch circuit 14, a pulse selector 16, an encoder 18, and a signal processing circuit 19.

The pulse circulating circuit 10 includes a ring or loop of a NAND circuit and a predetermined even number of inverters. In FIG. 1, the NAND circuit is denoted by "NAND", and the inverters are denoted by "INV". Specifically, a first input terminal of the NAND circuit receives the pulse signal PA from the control circuit 4. The NAND circuit is followed by a series or cascade combination of the inverters INV. The output terminal of the final inverter INV in the inverter cascade combination is connected to a second input terminal of the NAND circuit. The NAND circuit is triggered by a pulse of the signal PA. When the NAND circuit is triggered, a pulse starts to circulate through the ring in the pulse circulating circuit 10. During the circulation of a pulse through the ring, the pulse is successively inverted by the NAND circuit and the inverters INV.

The input terminal of the counter 12 is connected to the output terminal of the final inverter INV in the inverter cascade combination, that is, the inverter INV immediately preceding the NAND circuit in the ring, in the pulse circulating circuit 10. Pulses outputted from the final inverter INV are counted by this device 12. The pulse count number agrees with a number of times of complete revolution or circulation of a pulse through the ring. The counter 12 outputs data representing a binary number corresponding to the pulse count number. A reset terminal of the counter 12 is connected to the control circuit 4 to receive the counter reset signal CR therefrom. The counter 12 is periodically reset by the output signal CR of the control circuit 4.

The latch circuit 14 receives the output data of the counter 12. In addition, the latch circuit 14 receives the pulse signal PB from the control circuit 4. The latch circuit 14 samples the output data from the counter 12 in response to a pulse of the signal PB, and latches the sampled data.

The pulse selector 16 receives the output signals of the NAND circuit and the inverters INV in the pulse circulating circuit 10. In addition, the pulse selector 16 receives the pulse signal PB from the control circuit 4. The pulse selector 16 extracts a pulse signal circulating in the ring of the circuit 10 in response to a pulse of the signal PB, and generates and outputs a signal representing the position of the pulse signal relative to the ring on the basis of the output signals of the NAND circuit and the inverters INV in the pulse circulating circuit 10.

The encoder 18 receives the output signal of the pulse selector 16, and converts or encodes the output signal of the pulse selector 16 into corresponding digital data.

The signal processing circuit 19 receives the output data of the latch circuit 14 as higher-bit data. The signal processing circuit 19 receives the output data of the encoder 18 as lower-bit data. The signal processing circuit 19 includes a subtracter. The signal processing circuit 19 subtracts the higher-bit data from the lower-bit data, thereby generating output digital data DO1 representing a binary number corresponding to the difference between the phases of the pulse signals PA and PB. The digital data DO1 is transmitted from the encoder 18 to an external device (not shown) via a data output line 20.

The pulse phase difference encoding circuit 2 operates as follows. When the pulse signal PA outputted from the control circuit 4 changes from a low level to a high level, the pulse circulating circuit 10 starts circulating a pulse through the ring therein. While the pulse signal PA remains in the high level, the pulse circulating circuit 10 continues to circulate the pulse through the ring. The number of times of complete circulation of the pulse through the ring is measured or detected by the counter 12. When the pulse signal PB outputted from the control circuit 4 changes from a low level to a high level, the output data of the counter 12 is latched by the latch circuit 14. Thus, the output data of the latch circuit 14 represents the number of times of complete circulation of the pulse through the ring during the interval between the moment of the low-to-high change of the pulse signal PA and the subsequent moment of the low-to-high change of the pulse signal PB. Immediately after the moment of the low-to-high change of the pulse signal PB, the counter 12 is reset by the output signal CR of the control circuit 4.

In addition, when the pulse signal PB changes to the high level, the pulse selector 16 detects the current position of the pulse in the ring of the pulse circulating circuit 10. The output signal of the pulse selector 16 which represents the detected current position of the pulse is converted by the encoder 18 into the corresponding digital data. Thus, the output data of the encoder 18 represents the position of the pulse in the ring of the pulse circulating circuit 10 which occurs at the moment of the low-to-high change of the pulse signal PB.

The signal processing circuit 19 generates the digital data DO1 on the basis of the output data of the latch circuit 14 and the output data of the encoder 18. The digital data DO1 represents the interval Tc between the moment of the low-to-high change of the pulse signal PA and the subsequent moment of the low-to-high change of the pulse signal PB.

The pulse phase difference encoding circuit 2 except power feed designing may be basically similar to pulse phase difference encoding circuits which are shown, for example, in U.S. Pat. No. 5,128,624. The disclosure of U.S. Pat. No. 5,128,624 is hereby incorporated by reference.

The A/D converting circuit includes an input terminal 2a receiving an input voltage signal Vin which should be subjected to A/D conversion. The input terminal 2a is connected via a power feed line 10a to the power supply terminals of the NAND circuit and the inverters INV in the pulse circulating circuit 10. Thus, the NAND circuit and the inverters INV in the pulse circulating circuit 10 receive the input voltage signal Vin as a power supply voltage.

It was experimentally found that the speed of the signal inversion by each of the NAND circuit and the inverters INV in the pulse circulating circuit 10 depended on the power supply voltage applied thereto. Thus, the output data DO1 of the pulse phase difference encoding circuit 2 depends on the level of the input voltage signal Vin. Provided that the interval Tc between the moment of the low-to-high change of the pulse signal PA and the subsequent moment of the low-to-high change of the pulse signal PB is set to a fixed value, the digital output data DO1 accurately represents the level of the input voltage signal Vin.

Figure 2:
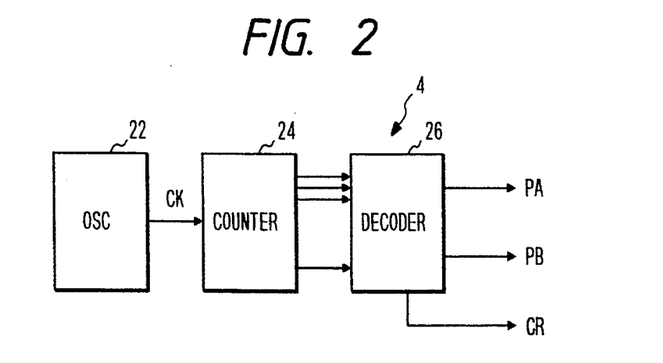
FIG. 2 is a block diagram of the control circuit of FIG. 1.
Figure 3:
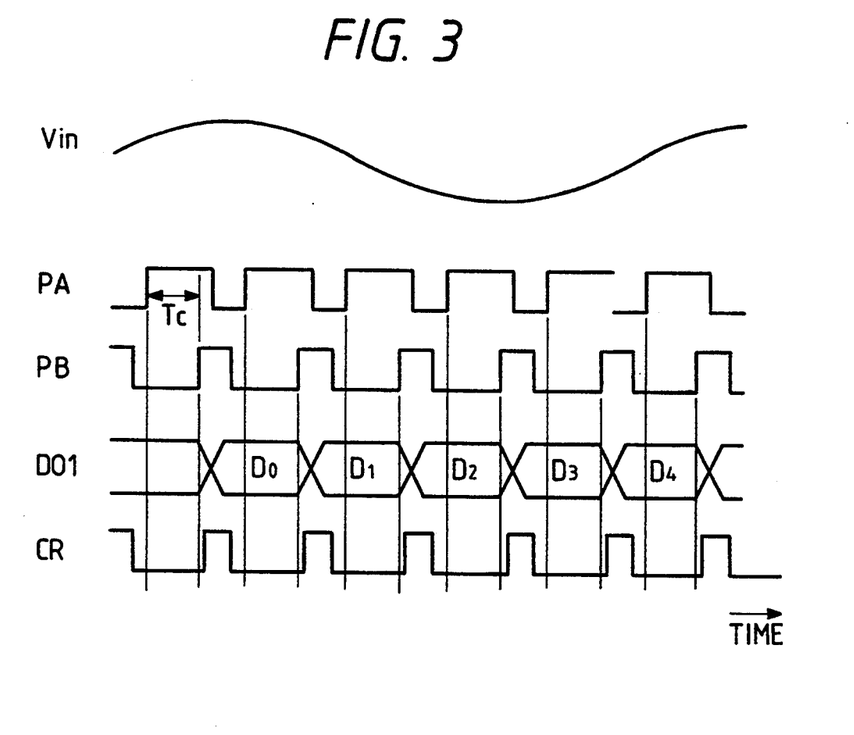
FIG. 3 is a time-domain diagram of various signals in the A/D converting circuit of FIG. 1.

As shown in FIG. 2, the control circuit 4 includes an oscillator 22, a counter 24, and a decoder 26. The oscillator 22 outputs a clock signal CK having a predetermined fixed frequency. The device 24 counts pulses of the clock signal CK. The decoder 26 generates the pulse signals PA and PB and the counter reset signal CR in response to the output signal of the counter 24. The pulse signals PA and PB and the counter reset signal CR have waveforms such as shown in FIG. 3. The interval Tc between the moment of a low-to-high change of the pulse signal PA and the subsequent moment of a low-to-high change of the pulse signal PB remains fixed. Immediately after the pulse signal PA changes from the low level to the high level, the counter reset signal CR changes from the low level to the high level.

The digital data DO1 outputted from the pulse phase difference encoding circuit 2 represents the level of the input voltage signal Vin. Thus, the input voltage signal Vin is converted into the corresponding digital signal DO1. This A/D conversion is periodically reiterated in response to the pulse signals PA and PB outputted from the control circuit 4. Therefore, the value represented by the output data DO1 is periodically updated as D0, D1, D2, ... in accordance with a variation in the input voltage signal Vin. The counter 12 is reset by the output signal CR of the control circuit 4 immediately after every A/D conversion is completed.

It should be noted that the pulse signal PB may be directly used to reset the counter 12 instead of the counter reset signal CR.

The A/D converting circuit can handle an input voltage signal variable in a small range without using an amplifier for the input voltage signal. Thus, the A/D converting circuit is free from a problem which might be caused by use of an amplifier at high temperatures, and hence the A/D converting circuit is suitable for use at high temperatures. As the interval Tc between the moment of a low-to-high change of the pulse signal PA and the subsequent moment of a low-to-high change of the pulse signal PB is longer, the resolution of A/D conversion increases. For example, when the interval Tc is doubled, the voltage corresponding to one bit of the output data DO1 is halved so that the resolution of A/D conversion is doubled. Thus, the resolution of A/D conversion can be easily adjusted.

Figure 4:
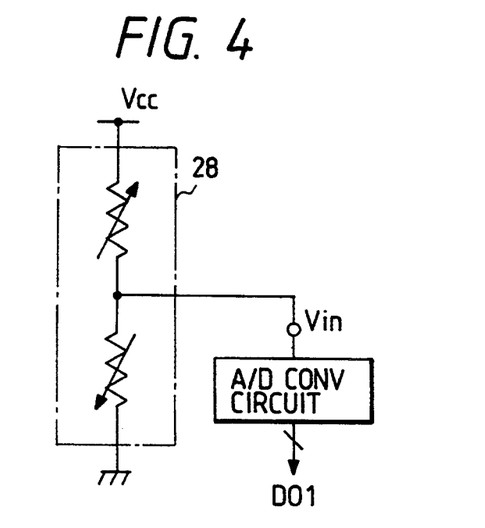
FIG. 4 is a diagram of a combination of a sensor and the A/D converting circuit of FIG. 1.

As shown in FIG. 4, the A/D converting circuit can be used in combination with a sensor 28. The sensor 28 includes a bridge network of resistors which is fed with a constant power supply voltage Vcc. The voltage at a central point in the bridge network varies in accordance with a sensed physical quantity such as a pressure, an acceleration, or a magnetic field intensity. The A/D converting circuit follows the sensor 28, and receives the voltage at the central point within the sensor 28 as an input voltage signal. Thus, the A/D converting circuit converts the central-point voltage into corresponding digital data DO1.

In the case where the output impedance of the sensor 28 and the input impedance of the A/D converting circuit are significantly different, an impedance matching circuit or an impedance converting circuit such as a source follower circuit may be provided between the sensor 28 and the A/D converting circuit.

The sensor 28 may be of a type including a Hall element instead of the bridge network. In this case, the A/D converting circuit processes a voltage depending on the conditions of the Hall element.

Figure 5:
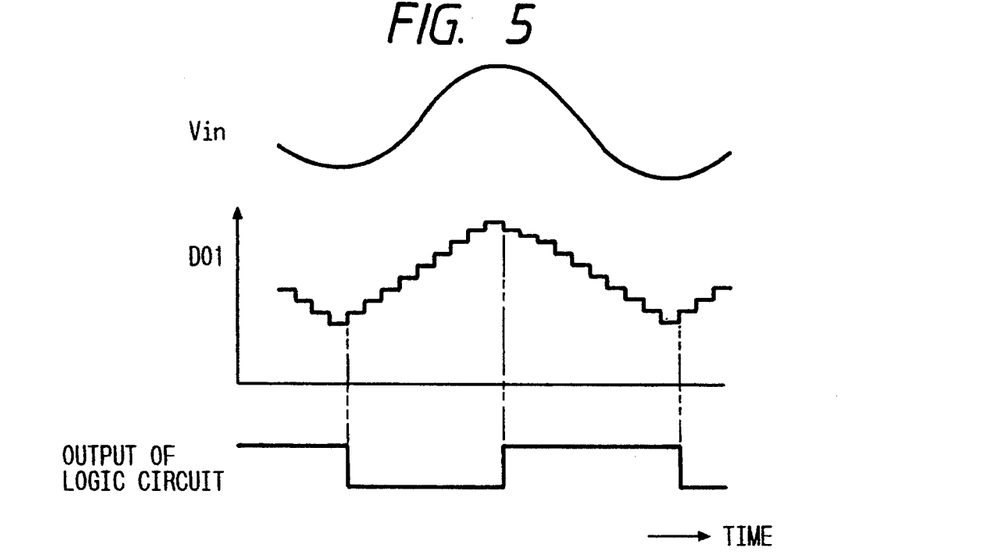
FIG. 5 is a time-domain diagram of various signals in a combination of a logic circuit and the A/D converting circuit of FIG. 1.

The A/D converting circuit may be followed by a logic circuit which outputs a high level signal when the output data DO1 of the A/D converting circuit increases in value, and which outputs a low level signal otherwise. In this case,, the value represented by the digital data DO1 and the output signal of the logic circuit vary in accordance with an input voltage signal Vin as shown in FIG. 5. The output signal of the logic circuit is a pulse signal synchronous with a variation in the input voltage signal Vin.

A further description will now be given of the NAND circuit and the inverters INV in the pulse circulating circuit 10, and the dependence of the speed of the signal inversion by each of the NAND circuit and the inverters INV upon the power supply voltage applied thereto.

Figure 12:
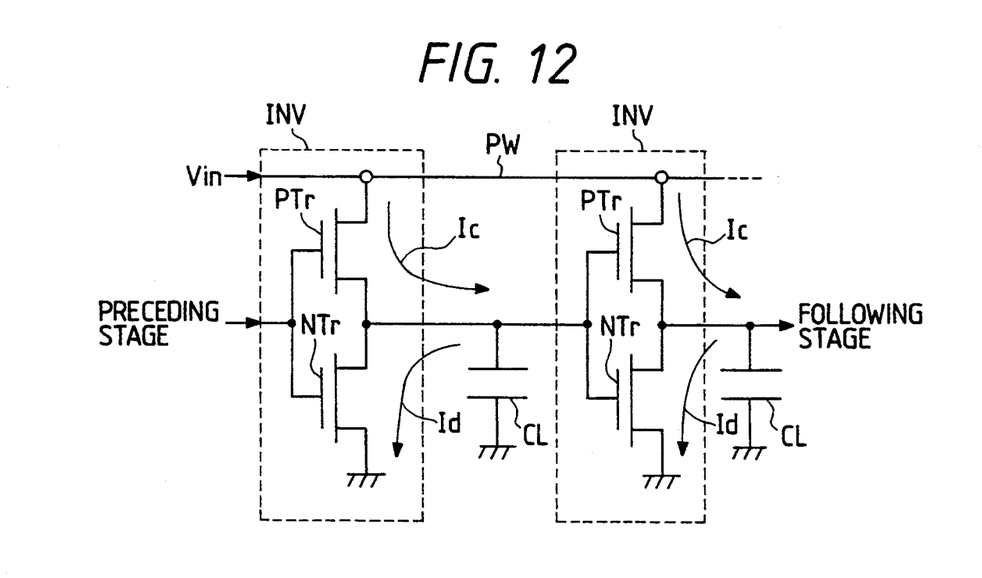
FIG. 12 is a schematic diagram of inverters in the A/D converting circuit of FIG. 1.

The inverters INV are of equal structures including CMOS circuits. As shown in FIG. 12, each inverter INV has a pair of a p-type MOS field-effect transistor PTr and an n-type MOS field-effect transistor NTr. The source-drain path of the p-type transistor PTr and the source-drain path of the n-type transistor NTr are connected in series. The combination of the source-drain paths of the transistors PTr and NTr is connected between a power feed line PW and the ground. The power feed line PW is subjected to the input voltage signal Vin. The gates of the transistors PTr and NTr are connected in common to a preceding stage. The sources of the transistors Frr and NTr are connected in common to a following stage. Parasitic capacitors CL are connected between the input side of the inverter INV and the ground, and the output side of the inverter INV and the ground.

It is well-known in the art that such a parasitic capacitor slows down the signal inverting operation of an inverter. The speed of the signal inversion of the inverter INV, that is, the inverting operation time of the inverter INV, is generally determined by the rates of charging and discharging the parasitic capacitor CL. The parasitic capacitor CL is charged by a drain current Ic through the p-type transistor PTr. The parasitic capacitor CL is discharged by a drain current Id of the n-type transistor NTr. As the level of the input voltage signal Vin rises, the drain currents Ic and Id through the transistors PTr and NTr increase so that the rates of charging and discharging the parasitic capacitor CL also increase. The increase in the rates of charging and discharging the parasitic capacitor CL results in a higher speed of the signal inversion or a shorter inverting operation time. Thus, the speed of the signal inversion or the inverting operation time varies in accordance with the level of the input voltage signal Vin.

Experiments were done in which the inverting operation time of an inverter made by 1.5-$\mu$m CMOS processing technologies was measured at varying levels of an input voltage signal Vin. During the experiments, the ambient temperature with respect to the inverter was 25° C. According to the results of the experiments, the measured values of the inverting operation time were 1,055 ps, 793 ps, 649 ps, and 564 ps at an input voltage value of 4.0 V, 5.0 V, 6.0 V, and 7.0 V respectively.

Figure 13:
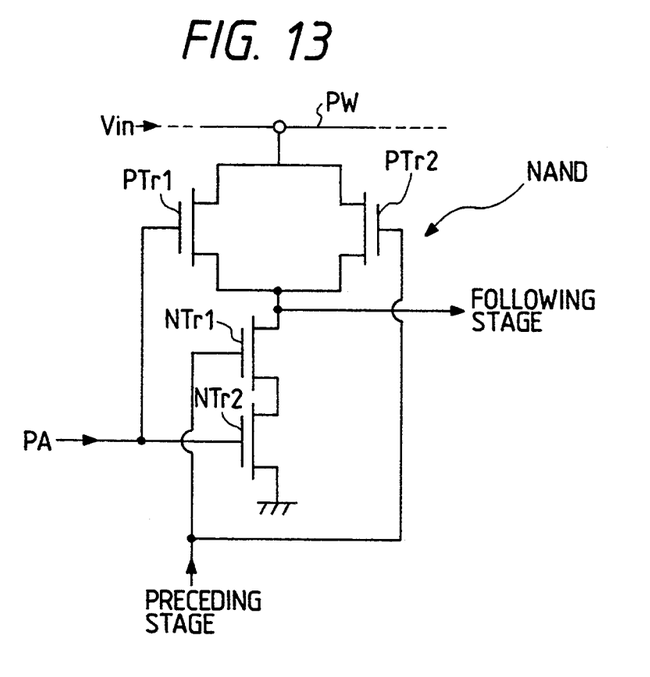
FIG. 13 is a schematic diagram of a NAND circuit in the A/D converting circuit of FIG. 1.

As shown in FIG. 13, the NAND circuit has p-type MOS field-effect transistors PTr1 and PTr2 and n-type MOS field-effect transistors NTr1 and NTr2. The sources of the p-type transistors PTr1 and PTr2 are connected in common to a power feed line PW subjected to the input voltage signal Vin. The gate of the p-type transistor PTr1 receives the pulse signal PA from the control circuit 4. The gate of the p-type transistor PTr2 is connected to a preceding stage. The drains of the p-type transistors PTr1 and PTr2 are connected in common to the drain of the n-type transistor NTr1. The junction among the drains of the p-type transistors PTr1 and PTr2 and the n-type transistor NTr1 are connected to a following stage. The gate of the n-type transistor NTr1 is connected to the preceding stage. The source of the n-type transistor NTr1 is connected to the drain of the n-type transistor NTr2. The gate of the n-type transistor NTr2 receives the pulse signal PA from the control circuit 4. The source of the n-type transistor NTr2 is grounded. Parasitic capacitors CL (not shown in FIG. 13) are connected between the input side of the NAND circuit and the ground, and the output side of the NAND circuit and the ground. The inverting operation time of the NAND circuit depends on the level of the input voltage signal Vin for a reason similar to the reason previously described regarding the inverter INV.

Figure 14:
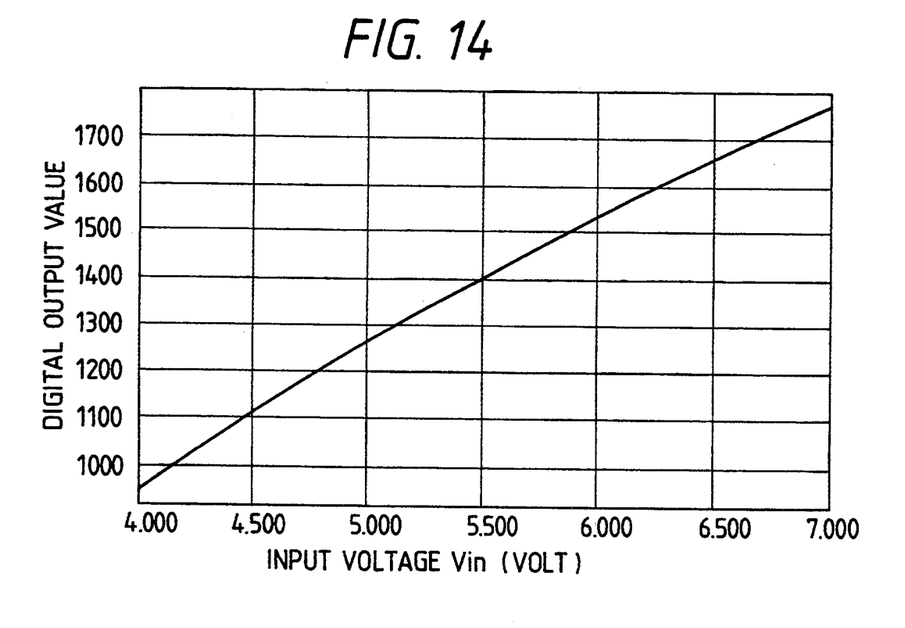
FIG. 14 is a diagram of the relation between an input voltage and an output digital data value in the A/D converting circuit of FIG. 1.

Experiments were done to measure the relation between the numerical value represented by the output digital data DO1 and the level of the input voltage signal Vin. The A/D converting circuit used in the experiments had a pulse circulating circuit 10 made by 1.5-$\mu$m CMOS processing technologies. During the experiments, the interval Tc between the moment of a low-to-high change of the pulse signal PA and the subsequent moment of a low-to-high change of the pulse signal PB was set to 1,000 ns and the ambient temperature with respect to the pulse circulating circuit 10 was 25° C. FIG. 14 shows the results of the experiments.

The operation of the A/D converting circuit will be further described. The counter 12, the latch 14, the pulse selector 16, and the encoder 18 cooperate to detect the total distance travelled by the pulse in the ring of the pulse circulating circuit 10 during the fixed interval Tc. In other words, a detection is given of the speed of circulation of the pulse through the ring. The speed of circulation of the pulse through the ring is determined by the inverting operation time of each of the NAND circuit and the inverters INV in the pulse circulating circuit 10. As previously described, the inverting operation time of each of the NAND circuit and the inverters INV depends on the level of the input voltage signal Vin. Thus, the speed of circulation of the pulse through the ring depends on the level of the input voltage signal Vin, and detection of the speed of circulation of the pulse through the ring enables detection of the level of the input voltage signal Vin. The digital data DO1 which depends on the result of the detection of the speed of circulation of the pulse through the ring is equal to digital data representing the input analog voltage Vin.

DESCRIPTION OF THE SECOND PREFERRED EMBODIMENT

Figure 6:
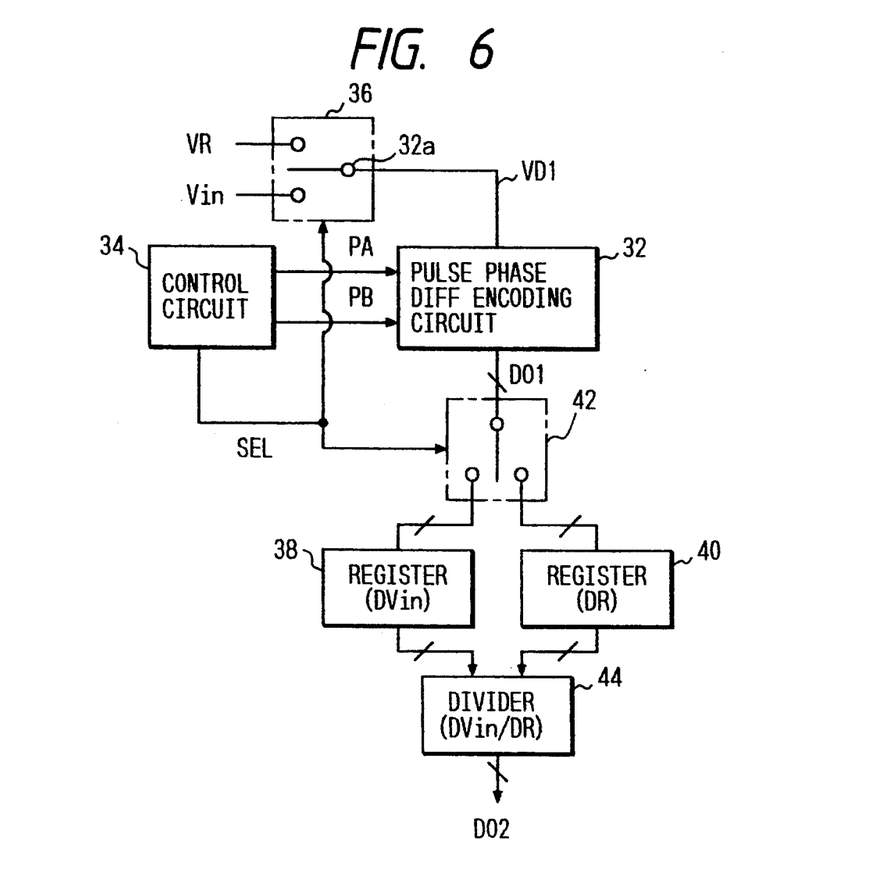
FIG. 6 is a block diagram of an A/D converting circuit according to a second embodiment of this invention.

With reference to FIG. 6, an A/D converting circuit includes a pulse phase difference encoding circuit 32 and a control circuit 34. The pulse phase difference encoding circuit 32 is similar to the pulse phase difference encoding circuit 2 of the embodiment of FIGS. 1–5, and 12–14. The control circuit 34 is basically similar to the control circuit 4 of the embodiment of FIGS. 1–5. The control circuit 34 includes a generator which produces pulse signals PA and PB and a counter reset signal CR (not shown in FIG. 6). In addition, the control circuit 34 includes a generator which produces a selection signal SEL. The pulse phase difference encoding circuit 32 receives the pulse signals PA and PB from the control circuit 34. This circuit 32 encodes a difference between phases of the pulse signals PA and PB into digital data DO1.

Figure 7:
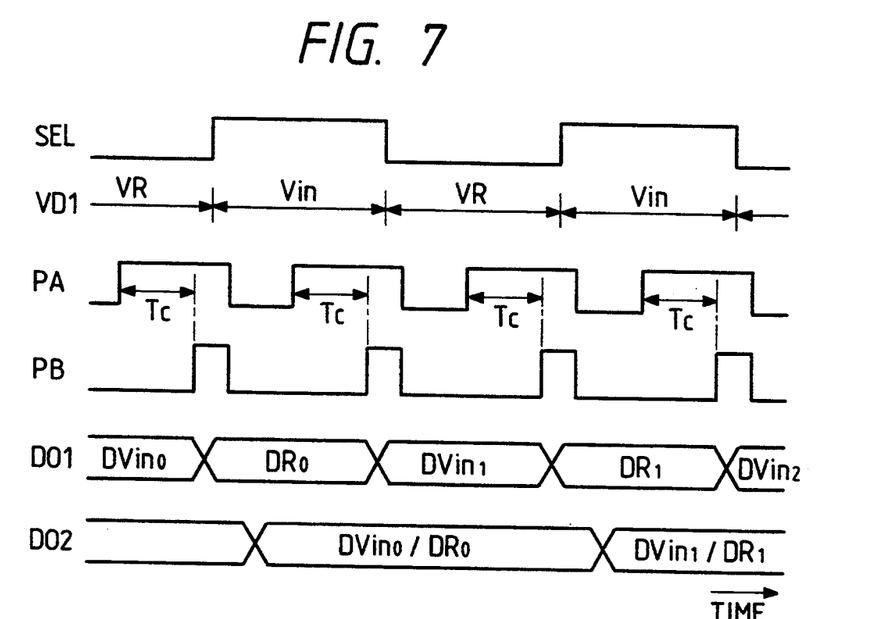
FIG. 7 is a time-domain diagram of various signals in the A/D converting circuit of FIG. 6.

As shown in FIG. 7, the selection signal SEL changes in logic level at a fixed timing which follows a low-to-high change of the pulse signal PB. The control circuit 34 may include a modified decoder which generates the selection signal SEL in response to the output signal of a counter. According to another example, the control circuit 34 includes a delay element receiving the pulse signal PB, and a flip-flop following the delay element. In this example, the combination of the delay element and the flip-flop generates the selection signal SEL from the pulse signal PB.

A switch 36 includes two fixed contacts subjected to an input voltage signal Vin and a reference signal VR respectively. The reference signal VR has a predetermined voltage. The switch 36 includes a movable contact which leads to an input terminal 32a of the pulse phase difference encoding circuit 32. The switch 36 includes a control terminal receiving the selection signal SEL from the control circuit 34. The switch 36 selectively connects the movable contact with one of the fixed contacts in response to the selection signal SEL. Thus, the switch 36 selects one of the input voltage signal Vin and the reference voltage signal VR in response to the selection signal SEL, and transmits the selected signal to the pulse phase difference encoding circuit 32.

A switch 42 includes a movable contact receiving the output data DO1 from the pulse phase difference encoding circuit 32. The switch 42 also includes two fixed contacts connected to the input terminals of registers 38 and 40 respectively. The switch 42 includes a control terminal receiving the selection signal SEL from the control circuit 34. The switch 42 selectively connects the movable contact with one of the fixed contacts in response to the selection signal SEL. Thus, the switch 42 feeds the output data DO1 from the pulse phase difference encoding circuit 32 to one of the registers 38 and 40 in response to the selection signal SEL. Specifically, the digital data DO1 which corresponds to the input voltage signal Vin is fed to and stored into the register 38 as information data DVin. On the other hand, the digital data DO1 which corresponds to the reference voltage signal VR is fed to and stored into the register 40 as reference data DR.

A divider 44 follows the registers 38 and 40. The divider 44 receives the digital data DVin and the digital data DR read out from the registers 38 and 40. As previously described, the digital data DVin corresponds to the input voltage signal Vin while the digital data DR corresponds to the reference voltage signal VR. The device 44 divides the digital data DVin corresponding to the input voltage signal Vin by the digital data DR corresponding to the reference voltage signal VR, and thereby corrects the digital data DVin into digital data DO2 in accordance with the reference data DR. The digital data DO2 represents the division result "DVin/DR".

The A/D converting circuit operates as follows. As shown in FIGS. 6 and 7, one of the input voltage signal Vin and the reference voltage signal VR is alternately and periodically selected by the switch 36 as an input signal VD1 to the pulse phase difference encoding circuit 32 in response to the selection signal SEL. Thus, the pulse phase difference encoding circuit 32 outputs the digital data DO1 which alternately and periodically represents one of the digital data DVin corresponding to the input voltage signal Vin and the digital data DR corresponding to the reference voltage signal VR. The digital data DVin corresponding to the input voltage signal Vin is stored into the register 38 via the switch 42. The digital data DR corresponding to the reference voltage signal VR is stored into the register 40 via the switch 42. The digital data DVin is transferred from the register 38 to the divider 44. The digital data DR is transferred from the register 40 to the divider 44. The device 44 divides the digital data DVin by the digital data DR, and thereby generates the digital data DO2 corresponding to the division result "DVin/DR". The digital data DO2 is final output data representing the result of A/D conversion of the input voltage signal Vin.

In some cases, the speed of the signal inversion by each of a NAND circuit and inverters INV in a pulse circulating circuit 10 of the pulse phase difference encoding circuit 32 tends to vary in accordance with a temperature. Even when the temperature varies, the digital data DO2 is substantially free from an accuracy reduction which would be caused by a temperature-responsive variation of the speed of the signal inversion by each of the NAND circuit and the inverters INV for the following reason. As the temperature varies, the digital data DVin corresponding to the input voltage signal Vin changes in accordance with the temperature variation. Similarly, the digital data DR corresponding to the reference voltage signal VR changes in accordance with the temperature variation. Dividing the digital data DVin by the digital data DR cancels the temperature-responsive changes in the digital data DVin and DR each other. Thus, the final output data DO2 is prevented from being adversely affected by the temperature-responsive variation in the speed of the signal inversion by each of the NAND circuit and the inverters INV. In other words, the final output data DO2 is substantially independent of the temperature variation.

DESCRIPTION OF THE THIRD PREFERRED EMBODIMENT

Figure 8:
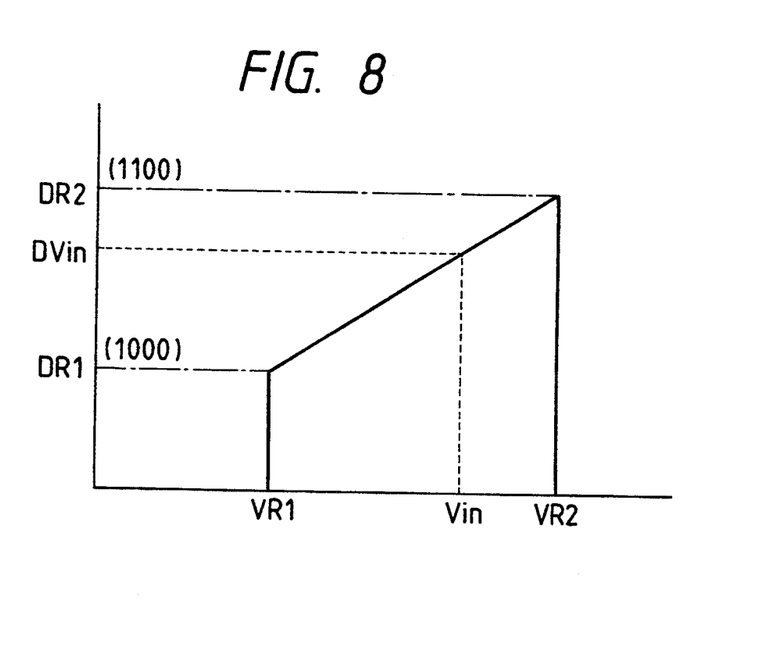
FIG. 8 is a diagram of the relation between an input voltage and a corresponding digital data value.

A theoretical base of an A/D converting circuit will be described hereinafter. As shown in FIG. 8, an input voltage signal Vin is variable between a minimum level VR1 and a maximum level VR2. The minimum level VR1 and the maximum level VR2 are used as reference voltage signals. Digital data DR1 corresponds to a result of A/D conversion of the minimum voltage signal VR1. Digital data DR2 corresponds to a result of A/D conversion of the maximum voltage signal VR2. The interval Tc between the moment of a low-to-high change of a pulse signal PA and the subsequent moment of a low-to-high change of a pulse signal PB is controlled by a PLL (phase locked loop) so that the difference "DR2−DR1" can be substantially fixed at a predetermined value (equal to, for example, 100=1,100−1,000) independent of a temperature variation or other condition changes. Thus, a voltage resolution (separation) per bit can be held fixed, and first digital data DVin representing a result of A/D conversion of a current input voltage signal Vin can be corrected into second digital data substantially free from an accuracy reduction which would be caused by a temperature variation.

In an example where the minimum voltage VR1 equals 4.5 V while the maximum voltage VR2 equals 5.5 V, a voltage value (voltage resolution) corresponding to one bit in LSB is given as:

$$LSB = (VR2 - VR1)/(DR2 - DR4) = 1,000/100 = 10 \ (mV)$$

The character VS is now introduced as an indication of the difference between the minimum voltage signal VR1 and the current input voltage signal Vin. In the case where the value represented by the output data DO1 of a pulse phase difference encoding circuit linearly varies with the input voltage signal Vin in the range between the minimum and maximum levels VR1 and VR2, the difference VS between the minimum voltage signal VR1 and the current input voltage signal Vin is given as:

$$VS = LSB \cdot (DVin - DR1)$$

Thus, the current input voltage signal Vin can be calculated from the following equation.

$$Vin = VR1 + LSB \cdot (DVin - DR1)$$

The A/D converting circuit is designed by using the theoretical base described above.

Figure 9:
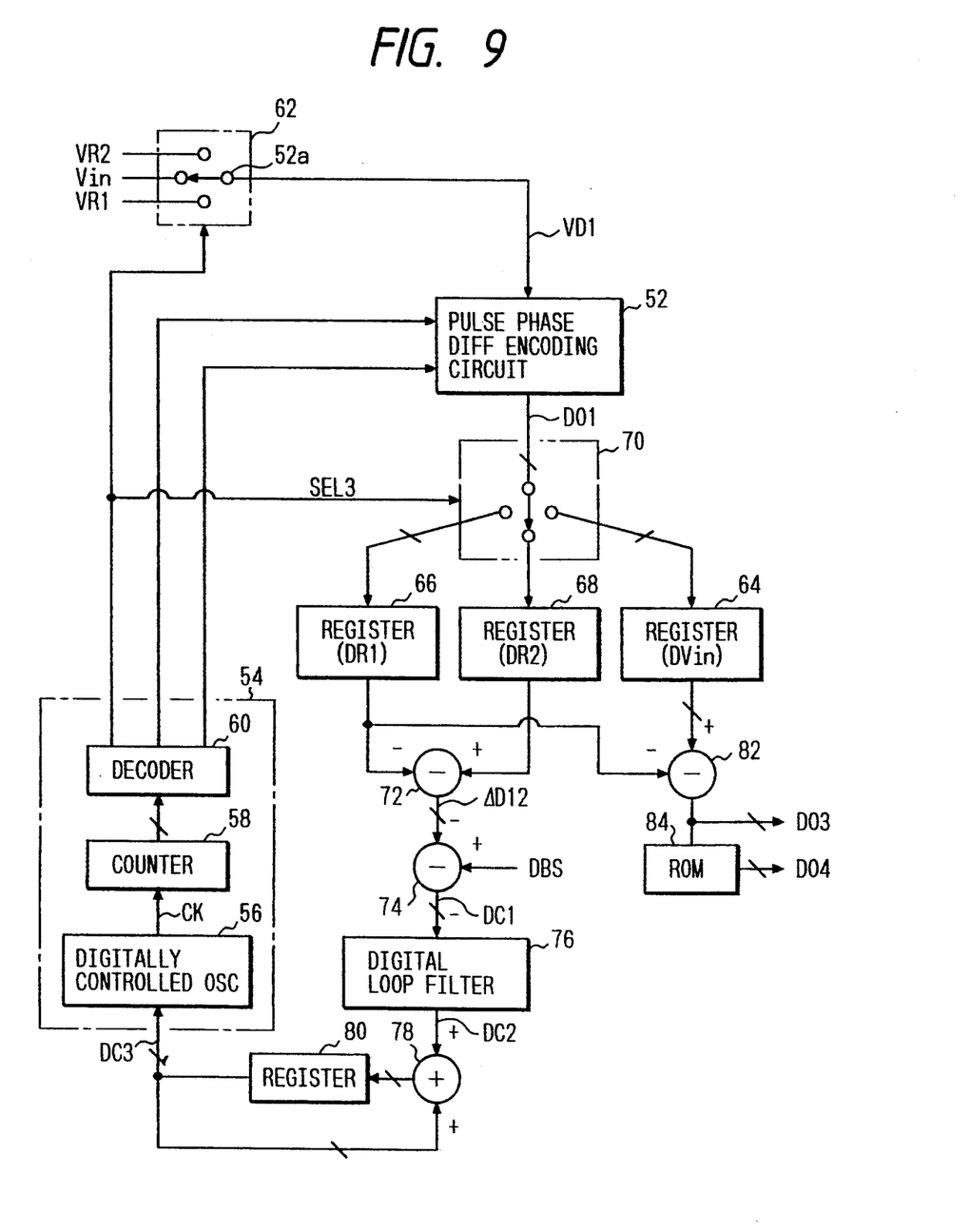
FIG. 9 is a block diagram of an A/D converting circuit according to a third embodiment of this invention.

The A/D converting circuit will be further described hereinafter. With reference to FIG. 9, the A/D converting circuit includes a pulse phase difference encoding circuit 52 and a control circuit 54. The pulse phase difference encoding circuit 52 is similar to the pulse phase difference encoding circuit 2 of the embodiment of FIGS. 1–5 and 12–14.

Figure 10:
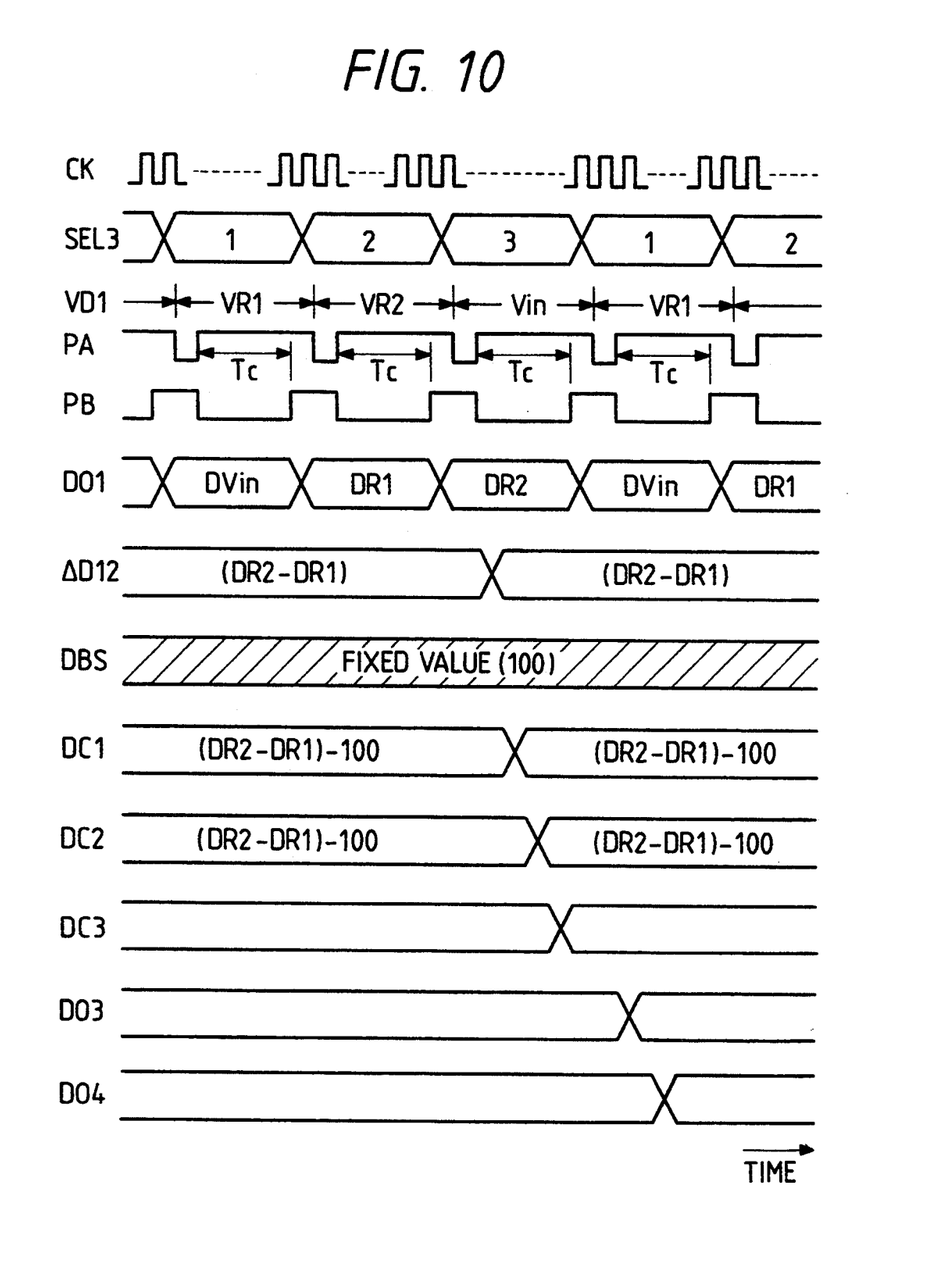
FIG. 10 is a time-domain diagram of various signals in the A/D converting circuit of FIG. 9.

The control circuit 54 includes a digitally-controlled oscillator 56, a counter 58, and a decoder 60. The oscillator 56 receives a digital control signal (control data) DC3, and outputs a clock signal CK having a frequency which is controlled in response to the digital control signal DC3. The clock signal CK has a waveform such as shown in FIG. 10. The device 58 counts pulses of the clock signal CK. The decoder 60 generates pulse signals PA and PB and a counter reset signal CR (not shown in FIG. 9) in response to the output signal of the counter 58. The pulse signals PA and PB have waveforms such as shown in FIG. 10. The decoder 60 also generates a selection signal SEL3 in response to the output signal of the counter 58. As shown in FIG. 10, the selection signal SEL3 periodically and cyclically changes among three different states "1", "2", and "3" at a timing which follows each low-to-high change of the pulse signal PB. Since the frequency of the clock signal CK is controlled in response to the digital control signal DC3, the output signal of the counter 58 and also the pulse signals PA and PB depend on the control signal DC3. Specifically, the interval Tc between the moment of a low-to-high change of the pulse signal PA and the subsequent moment of a low-to-high change of the pulse signal PB is controlled in response to the control signal DC3.

The pulse phase difference encoding circuit 52 receives the pulse signals PA and PB from the control circuit 54. This circuit 52 encodes a difference between phases of the pulse signals PA and PB into digital data DO1.

A switch 62 includes three fixed contacts subjected to an input voltage signal Vin, the minimum voltage signal VR1, and the maximum voltage signal VR2 respectively. The switch 62 includes a movable contact which leads to an input terminal 52a of the pulse phase difference encoding circuit 52. The switch 62 includes a control terminal receiving the selection signal SEL3 from the control circuit 54. The switch 62 selectively connects the movable contact with one of the fixed contacts in response to the selection signal SEL3. Thus, the switch 62 periodically and cyclically selects one of the input voltage signal Vin, the minimum voltage signal VR1, and the maximum voltage signal VR2 in response to the selection signal SEL3, and transmits the selected signal VD1 to the pulse phase difference encoding circuit 62. Thus, the input signal VD1 to the pulse phase difference encoding circuit 62 periodically and cyclically changes among the input voltage signal Vin, the minimum voltage signal VR1, and the maximum voltage signal VR2 as shown in FIG. 10.

A switch 70 includes a movable contact receiving the output data DO1 from the pulse phase difference encoding circuit 52. The switch 70 also includes three fixed contacts connected to the input terminals of registers 64, 66, and 68 respectively. The switch 70 includes a control terminal receiving the selection signal SEL3 from the control circuit 54. The switch 70 selectively connects the movable contact with one of the fixed contacts in response to the selection signal SEL3. Thus, the switch 70 periodically and cyclically feeds the output data DO1 from the pulse phase difference encoding circuit 52 to one of the registers 64, 66, and 68 in response to the selection signal SEL3. Specifically, the digital data DO1 which corresponds to the input voltage signal Vin is fed to and stored into the register 64 as information data DVin. The digital data DO1 which corresponds to the minimum voltage signal VR1 is fed to and stored into the register 66 as reference data DR1. The digital data DO1 which corresponds to the maximum voltage signal VR2 is fed to and stored into the register 68 as reference data DR2. In other words, the output data DO1 periodically and cyclically changes among the information data DVin, the reference data DR1, and the reference data DR2 as shown in FIG. 10.

The interval Tc between the moment of a low-to-high change of the pulse signal PA and the subsequent moment of a low-to-high change of the pulse signal PB is controlled so that the difference between the reference data DR1 corresponding to the minimum voltage signal VR1 and the reference data DR2 corresponding to the maximum voltage signal VR2 can be substantially held at a predetermined fixed value DBS. The hardware arrangement for enabling this control will be further described hereinafter.

The reference data DR1 is transferred from the register 66 to a subtracter 72. The reference data DR2 is transferred from the register 68 to the subtracter 72. The subtracter 72 executes subtraction between the reference data DR1 and the reference data DR2, and thereby generates data ΔD12 representing the difference between the reference data DR1 and the reference data DR2. Here, ΔD12=DR2−DR1. The subtracter 72 outputs the difference data ΔD12 to another subtracter 74. The subtracter 74 receives reference data DBS from a suitable signal source (not shown). The reference data DBS represents the predetermined fixed value which equals a target value of the interval Tc between the moment of a low-to-high change of the pulse signal PA and the subsequent moment of a low-to-high change of the pulse signal PB. The predetermined fixed value DBS is equal to, for example, 100 as shown in FIG. 10. The subtracter 74 executes subtraction between the difference data ΔD12 and the reference data DBS, and thereby generates data DC1 representing the difference between the difference data ΔD12 and the reference data DBS. Here, DC1=DBS−ΔD12. The subtracter 74 outputs the difference data DC1 to a digital loop filter 76. The digital loop filter 76 removes high-frequency noise components from the difference data DC1, thereby generating noise-free data DC2 from the difference data DC1. The digital loop filter 76 outputs the noise-free data DC2 to an adder 78. The device 78 adds the noise-free data DC2 and the control data DC3. As previously described, the control data DC3 determines the oscillation frequency of the digitally-controlled oscillator 56 within the control circuit 54. The adder 78 outputs data representing the result of the addition. The output data of the adder 78 is stored into a register 80 as next control data DC3. The data read out from the register 80 is used as new control data DC3 which is fed to the control circuit 56 and also the adder 78. The data ΔD12, the data DC1, the data DC2, and the data DC3 are periodically updated at timings such as shown in FIG. 10.

When the difference data DC1 between the data ΔD12 and the data DBS corresponds to a positive value, the positive data DC2 is added to the current control data DC3 to generate next control data DC3. As a result, the control data DC3 increases in value. The oscillation frequency of the digitally-controlled oscillator 56 rises in response to the increased control data DC3 so that the interval Tc between the moment of a low-to-high change of the pulse signal PA and the subsequent moment of a low-to-high change of the pulse signal PB is shortened. The shortened interval Tc results in change or movement of the data ΔD12 toward the data DBS. On the other hand, when the difference data DC1 between the data ΔD12 and the data DBS corresponds to a negative value, the negative data DC2 is added to the current control data DC3 to generate next control data DC3. As a result, the control data DC3 decreases in value. The oscillation frequency of the digitally-controlled oscillator 56 drops in response to the decreased control data DC3 so that the interval Tc between the moment of a low-to-high change of the pulse signal PA and the subsequent moment of a low-to-high change of the pulse signal PB is lengthened. The lengthened interval Tc results in change or movement of the data ΔD12 toward the data DBS. As a result of such processes, the data ΔD12 representing the difference between the reference data DR1 and the reference data DR2 is held substantially equal to the reference data DBS.

In addition, the reference data DR1 is transferred from the register 66 to a subtracter 82. The information data DVin is transferred from the register 64 to the subtracter 82. The subtracter 82 executes subtraction between the reference data DR1 and the information data DVin, and thereby generates data DO3 representing the difference between the reference data DR1 and the information data DVin. Here, DO3=DVin−DR1. The subtracter 82 outputs the difference data DO3 to a ROM 84 and also an external device (not shown). The ROM 84 stores data for correcting the difference data DO3 into final output data DO4 representing the level of the input voltage signal Vin. Thus, the ROM 84 converts the difference data DO3 into the final output data DO4. The final output data DO4 is transmitted from the ROM 84 to an external device (not shown). The data DO3 and the data DO4 are periodically updated at timings such as shown in FIG. 10.

Figure 11:
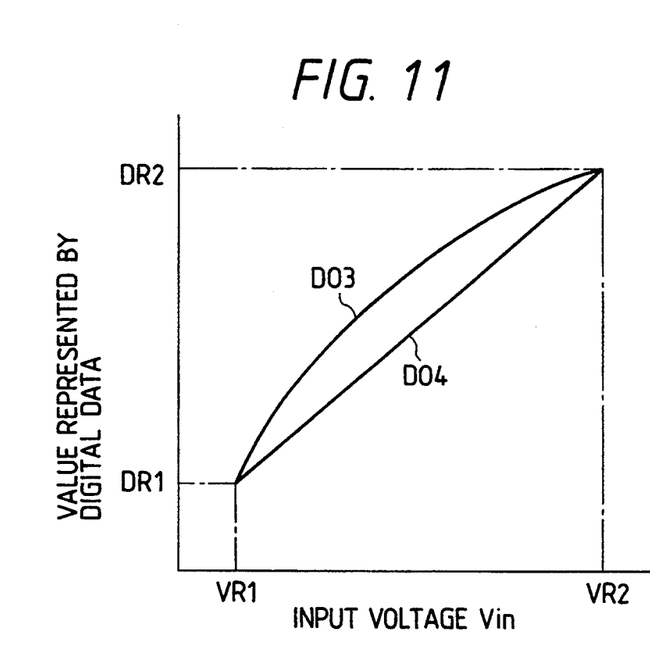
FIG. 11 is a diagram of the relation between an input voltage and corresponding digital data values.

The device 82 subtracts the reference data DR1 from the information data DVin, generating the digital data DO3 representing the voltage level of the input voltage signal Vin with respect to the minimum voltage signal VR1. As shown in FIG. 11, the value represented by the digital data DO3 varies nonlinearly with the input voltage Vin. The ROM 84 stores the data representing corrective values to compensate for the nonlinearity. The ROM 84 corrects the digital data DO3 into the final output data DO4 representing a value which varies linearly with the input voltage Vin as shown in FIG. 11. The nonlinearity is caused by characteristics of a NAND circuit and inverters of a pulse circulating circuit within the pulse phase difference encoding circuit 52. Specifically, the cause of the nonlinearity is that signal delay times provided by the NAND circuit and the inverters are out of one-to-one correspondence with a variation in the power supply voltage fed thereto.

The subtracters 72 and 74, the digital loop filter 76, the adder 78, the register 80, and the digitally-controlled oscillator 56 compose a digital PLL. The interval Tc between the moment of a low-to-high change of the pulse signal PA and the subsequent moment of a low-to-high change of the pulse signal PB is controlled by the PLL so that the difference ΔD12 between the reference data DR1 and the reference data DR2 can be substantially held at the predetermined fixed value DBS (equal to, for example, 100). Thus, even in cases where the speed of the signal inversion by each of the NAND circuit and the inverters INrV of the pulse circulating circuit within the pulse phase difference encoding circuit 52 changes due to a temperature variation or other causes, the digital data DO3 continues to accurately represent the input voltage Vin. Correcting the digital data DO3 by the ROM 84 provides the final output data DO4 which varies in one-to-one correspondence with the input voltage Vin.

The corrective data stored in the ROM 84 may be modified so that the value represented by the final output data DO4 can vary as a suitable non-linear function, such as a sinusoidal function, of the input voltage Vin.

The digitally-controlled oscillator 56 may be of a type shown in U.S. patent application Ser. No. 956,955, filed on Oct. 2, 1992, entitled "VARIABLE-FREQUENCY OSCILLATION CIRCUIT AND A DIGITALLY CONTROLLED OSCILLATOR", the disclosure of which is hereby incorporated by reference. The digitally-controlled oscillator 56 may also be of known types, for example, a type including a digital-to-analog (D/A) converter, a voltage-controlled oscillator, and a waveform shaping circuit. In this case, the control data DC3 is converted by the D/A converter into a corresponding analog signal, and the analog signal is fed to the voltage-controlled oscillator as a control signal. Thus, the voltage-controlled oscillator generates a signal having a frequency depending on the control data DC3. The output signal of the voltage-controlled oscillator is transformed by the waveform shaping circuit into the clock signal CK having a rectangular waveform.

What is claimed is:

1. An A/D converting circuit for converting an analog voltage signal into corresponding digital data, comprising:

a pulse circulating circuit which includes inverting circuits each for inverting an input signal thereto and outputting an inversion of the input signal, wherein a time of signal inversion by each of the inverting circuits varies in accordance with a power supply voltage applied thereto, wherein one of the inverting circuits constitutes an inverting circuit for starting which is controllable in inversion operation, and wherein the pulse circulating circuit circulates a pulse signal therethrough after the inverting circuit for starting starts to operate;

an input terminal subjected to the analog voltage signal and connected to power supply lines of the respective inverting circuits for applying the analog voltage signal to the inverting circuits as a power supply voltage fed thereto;

a counter for counting a number of times of complete circulation of the pulse signal through the pulse circulating circuit, and for outputting digital data representing a result of said counting;

circulation position detecting means for detecting a circulation position of the pulse signal in the pulse circulating circuit on the basis of output signals of the respective inverting circuits, and for outputting digital data representing the detected circulation position of the pulse signal;

control means for activating the inverting circuit for starting and thereby starting pulse circulating operation of the pulse circulating circuit, and for activating the circulation position detecting means at a moment which follows a moment of said starting pulse circulating operation by a given time; and output means for outputting digital data as an A/D conversion result, the A/D conversion result data having lower bits composed of the output digital data of the circulation position detecting means and higher bits composed of the output digital data of the counter.

2. The A/D converting circuit of claim 1, wherein the A/D conversion result data corresponds to an interval of time from a moment of said starting pulse circulating operation of the pulse circulating circuit to a moment of said activation of the circulation position detecting means.

3. The A/D converting circuit of claim 1, wherein the A/D conversion result data varies in accordance with the analog voltage signal applied to the inverting circuits as the power supply voltage.

4. The A/D converting circuit of claim 1, wherein the power supply voltage is analog.

5. The A/D converting circuit of claim 1, wherein the control means comprises an oscillator for generating a clock signal, a counter for counting pulses of the clock signal, and a decoder for decoding an output signal of the counter into a pulse signal to start pulse circulating operation of the pulse circulating circuit, and into a pulse signal to activate the circulation position detecting means.

6. The A/D converting circuit of claim 1, further comprising a sensing element for generating a voltage which varies in accordance with a change in a physical quantity, the input terminal being connected to the sensing element to receive the voltage generated by the sensing element.

7. The A/D converting circuit of claim 6, further comprising an impedance converting circuit connected between the sensing element and the input terminal.

8. The A/D converting circuit of claim 6, wherein the sensing element includes a bridge circuit.

9. The A/D converting circuit of claim 6, wherein the sensing element includes a Hall element.

10. The A/D converting circuit of claim 1, further comprising:
input voltage selecting means for selecting and feeding one of the analog voltage signal and a predetermined reference voltage signal to the input terminal;
memory means for memorizing the A/D conversion result data when the reference voltage signal is fed to the input terminal by the input voltage selecting means; and
a divider for dividing the A/D conversion result data, which occurs when the analog voltage signal is fed to the input terminal by the input voltage selecting means, by the A/D conversion result data memorized in the memory means, and for outputting data representing a result of said dividing as data of a final A/D conversion result.

11. The A/D converting circuit of claim 1, wherein the control means comprises a variable-frequency oscillator for generating a variable-frequency pulse signal, a counter for counting pulses of the variable-frequency pulse signal and outputting a signal representative of a result of said counting, and timing setting means for determining a timing of starting pulse circulating operation of the pulse circulating circuit and a timing of activating the circulation position detecting means in response to the output signal of the counter, the A/D converting circuit further comprising:
input voltage selecting means for selecting and feeding one of the analog voltage signal, a first predetermined reference voltage signal, and a second predetermined reference voltage signal to the input terminal;
first memory means for memorizing the A/D conversion result data when the first reference voltage signal is fed to the input terminal by the input voltage selecting means;
second memory means for memorizing the A/D conversion result data when the second reference voltage signal is fed to the input terminal by the input voltage selecting means;
oscillation frequency adjusting means for deriving a difference between the data memorized in the first memory means and the data memorized in the second memory means, and for adjusting an oscillation frequency of the variable-frequency oscillator so that the difference between the data memorized in the first memory means and the data memorized in the second memory means can be equal to a predetermined fixed value; and
difference calculating means for deriving a difference between the A/D conversion result data and the data memorized in the first memory means when the analog voltage signal is fed to the input terminal by the input voltage selecting means, and for outputting data of the difference between the A/D conversion result data and the data memorized in the first memory means as data of a final A/D conversion result.

12. The A/D converting circuit of claim 11, wherein the variable-frequency oscillator comprises a digitally-controlled oscillator.

13. The A/D converting circuit of claim 11, wherein the first predetermined reference voltage signal and the second predetermined reference voltage signal correspond to a lower limit and an upper limit of a range in which the analog voltage signal is variable.

14. An A/D converting circuit comprising:
means for selecting either an input analog signal or a predetermined reference analog signal;
means, including a loop circuit, for circulating a pulse signal through the loop circuit at a variable speed;
means for varying the speed of circulation of the pulse signal through the loop circuit in response to the analog signal selected by the selecting means;
means for detecting the speed of circulation of the pulse signal through the loop circuit;
means for generating a first digital signal in response to the detected speed of circulation of the pulse signal through the loop circuit when the analog signal selected by the selecting means is the input analog signal;
means for generating a second digital signal in response to the detected speed of circulation of the pulse signal through the loop circuit when the analog signal selected by the selecting means is the reference analog signal; and means for correcting the first digital signal into a third digital signal in response to the second digital signal, the third digital signal representing a result of A/D conversion of the input analog signal.

15. An A/D converting circuit comprising:

means for iteratively selecting either of an input analog signal, a first predetermined reference analog signal, and a second predetermined reference analog signal, wherein the input analog signal is variable in a given range defined between a lower limit and an upper limit, and wherein the first predetermined reference analog signal and the second predetermined reference analog signal correspond to the lower limit and the upper limit respectively;

means, including a loop circuit, for circulating a pulse signal through the loop circuit at a variable speed;

means for varying the speed of circulation of the pulse signal through the loop circuit in response to the analog signal selected by the selecting means;

means for detecting a distance travelled by the pulse signal circulated through the loop circuit during an adjustable interval;

means for generating a first digital signal in response to the detected distance when the analog signal selected by the selecting means is the first reference analog signal;

means for generating a second digital signal in response to the detected distance through the loop circuit when the analog signal selected by the selecting means is the second reference analog signal;

means for generating a third digital signal corresponding to a difference between the first digital signal and the second digital signal;

means for adjusting the interval in response to the third digital signal and a fourth digital signal which represents a predetermined fixed difference between the first digital signal and the second digital signal so as to hold the third digital signal substantially equal to the fourth digital signal; and means for generating a fifth digital signal in response to the detected distance when the analog signal selected by the selecting means is the input analog signal, the fifth digital signal representing a result of A/D conversion of the input analog signal.

16. An A/D converting circuit comprising:

means, including a plurality of delay elements connected in series and having respective delay times dependent on an analog signal applied thereto, for passing a pulse signal therethrough at a speed determined by said delay times;

means for varying the speed of passing the pulse signal through the delay elements by applying the analog signal;

means for detecting a number of the delay elements which the pulse signal has passed through during a predetermined time period; and means for generating a digital signal in response to the detected number, the digital signal representing a result of A/D conversion of the analog signal.

17. An A/D converting circuit comprising:

means for inputting an analog signal;

a plurality of delay elements connected in series and having respective delay times which vary in response to the analog signal, wherein a first-stage delay element among said delay elements receives a first pulse signal, and the first pulse signal is successively delayed and propagated via the delay elements;

a control circuit for generating a second pulse signal separated form the first pulse signal by a given time interval; and data outputting means for receiving the second pulse signal, detecting a position of the first pulse signal delayed and propagated via the delay elements, and generating a digital signal in response to the detected position, the digital signal corresponding to the analog signal.

18. The A/D converting circuit of claim 17, wherein an output side of a final-stage delay element among said delay elements is connected to an input side of said first-stage delay element so that the first pulse can be circulated.

19. The A/D converting circuit of claim 18, wherein the data outputting means comprises a counter for counting a number of times of circulation of the first pulse signal through the delay elements.

20. The A/D converting circuit of claim 19, wherein the data outputting means comprises means for latching an output signal of the counter when the second pulse signal is inputted.

21. The A/D converting circuit of claim 20, wherein the data outputting means comprises:

means for receiving the second pulse signal and detecting the position of the first pulse signal delayed and propagated via the delay elements;

means for generating a position-representing digital signal corresponding to the detected position; and means for generating the digital signal corresponding to the analog signal in response to an output signal of the latching means and the position-representing digital signal.

* * * * *